(12) United States Patent
Jeon et al.

(10) Patent No.: US 11,152,440 B2
(45) Date of Patent: Oct. 19, 2021

(54) DISPLAY APPARATUS WITH THIN PAD-AREA INSULATOR AND METHOD OF MANUFACTURING THE SAME

(71) Applicant: Samsung Display Co., Ltd., Yongin-si (KR)

(72) Inventors: Yujin Jeon, Yongin-si (KR); Sukyoung Kim, Yongin-si (KR); Wonse Lee, Yongin-si (KR); Donghyeon Jang, Yongin-si (KR)

(73) Assignee: SAMSUNG DISPLAY CO., LTD., Yongin-Si (KR)

( * ) Notice: Subject to any disclaimer, the term of this patent is extended or adjusted under 35 U.S.C. 154(b) by 0 days.

(21) Appl. No.: 16/809,160

(22) Filed: Mar. 4, 2020

(65) Prior Publication Data

US 2020/0411618 A1 Dec. 31, 2020

(30) Foreign Application Priority Data

Jun. 28, 2019 (KR) .......................... 10-2019-0078339

(51) Int. Cl.
*H01L 27/32* (2006.01)
*H01L 23/00* (2006.01)

(52) U.S. Cl.
CPC .......... *H01L 27/3258* (2013.01); *H01L 24/32* (2013.01); *H01L 27/3276* (2013.01); *H01L 2224/32148* (2013.01); *H01L 2227/323* (2013.01)

(58) Field of Classification Search
CPC . H01L 27/3258; H01L 27/3276; H01L 24/32; H01L 2224/32148; H01L 2227/323
See application file for complete search history.

(56) References Cited

U.S. PATENT DOCUMENTS

| | | | |
|---|---|---|---|
| 7,599,039 B2 | 10/2009 | Yasuda et al. | |
| 7,859,604 B2 | 12/2010 | Jeong et al. | |
| 2008/0135845 A1* | 6/2008 | Heo | H01L 27/124 257/59 |
| 2008/0204618 A1* | 8/2008 | Jung | G02F 1/13452 349/40 |
| 2011/0284853 A1* | 11/2011 | Park | H01L 27/1244 257/59 |
| 2015/0187803 A1* | 7/2015 | Moh | G02F 1/13452 257/43 |
| 2016/0118420 A1* | 4/2016 | Yang | H01L 27/1255 257/40 |
| 2017/0207416 A1 | 7/2017 | Kim et al. | |

(Continued)

FOREIGN PATENT DOCUMENTS

| | | |
|---|---|---|
| JP | 2011-211245 | 10/2011 |
| JP | 4816297 | 11/2011 |

(Continued)

*Primary Examiner* — Lex H Malsawma
(74) *Attorney, Agent, or Firm* — Kile Park Reed & Houtteman PLLC

(57) ABSTRACT

A display apparatus is provided, including a panel including a substrate including a display area where pixels are disposed, and a pad area where a terminal portion connected to the display area is disposed, and an insulating layer disposed over a same layer as in the display area and the pad area. A thickness of the insulating layer in the display area and a thickness of the insulating layer in the pad area are of different thicknesses.

22 Claims, 11 Drawing Sheets

(56) References Cited

U.S. PATENT DOCUMENTS

2018/0151849 A1 5/2018 Kim et al.
2018/0366529 A1* 12/2018 Lee .................... H01L 51/0031

FOREIGN PATENT DOCUMENTS

| KR | 10-0742376 | 7/2007 |
| KR | 10-2018-0061877 | 6/2018 |
| KR | 10-1890215 | 8/2018 |

* cited by examiner

DISPLAY APPARATUS WITH THIN PAD-AREA INSULATOR AND METHOD OF MANUFACTURING THE SAME

CROSS-REFERENCE TO RELATED APPLICATION

This application claims priority to and benefits of Korean Patent Application No. 10-2019-0078339 under 35 U.S.C. § 119, filed in the Korean Intellectual Property Office on Jun. 28, 2019, the entire contents of which are incorporated herein by reference.

BACKGROUND

1. Technical Field

One or more embodiments relate to display apparatuses and manufacturing methods thereof, and to an organic light-emitting display apparatus in which a pad area including a terminal portion to which a driving chip is connected has an improved structure, and a method of manufacturing the organic light-emitting display apparatus.

2. Description of Related Art

Display apparatuses such as organic light-emitting display apparatuses include, for example, a panel including a display area and a pad area on a substrate, and a driving chip connected to a terminal portion of the pad area.

Accordingly, the display area, where an image is realized, and the driving chip, functioning as a controller, are connected to each other via the terminal portion, and, when this connection is stably established, the display apparatuses may function smoothly.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

One or more embodiments include an improved display apparatus in which a stable connection between a terminal portion and a driving chip in a pad area may be realized, and a method of manufacturing the display apparatus.

According to one or more embodiments, a display apparatus may include a panel including substrate including a display area where a plurality of pixels are disposed, and a pad area where a terminal portion connected to the display area is disposed, and an insulating layer disposed over a same layer in the display area and the pad area, wherein a thickness of the insulating layer in the display area and a thickness of the insulating layer in the pad area may be of different thicknesses; and a driving chip connected to the terminal portion of the pad area.

The thickness of the insulating layer in the pad area may be less than the thickness of the insulating layer in the display area.

A thickness of the insulating layer in the entire pad area may be less than the thickness of the insulating layer in the display area.

The terminal portion may be a closed loop, and a thickness of the insulating layer in an inside of the closed loop within the pad area may be less than a thickness of the insulating layer in an outside of the closed loop.

The thickness of the insulating layer in the pad area may be about 50% or less than that of the thickness of the insulating layer in the display area.

A difference between the thickness of the insulating layer in the pad area and a thickness of the terminal portion in the pad area may be about 50% or less than that of the thickness of the terminal portion.

In each of the plurality of pixels of the display area, an active layer, a gate electrode, a first source/drain electrode, a second source/drain electrode, and a pixel electrode may be stacked, and the insulating layer may include a first via layer between the first source/drain electrode and the second source/drain electrode, and a second via layer between the second source/drain electrode and the pixel electrode.

The display apparatus may further include a scan line and a data line connected to each of the plurality of pixels of the display area. The scan line may be disposed over a same layer as a layer over which the first source/drain electrode is disposed, and may include a same material as a material included in the first source/drain electrode, and the data line may be over a same layer as a layer over which the second source/drain electrode is disposed, and may include a same material as a material included in the second source/drain electrode.

An embedded circuit that inspects a normality or abnormality of the terminal portion may be disposed in the pad area, and the insulating layer may cover and protect the embedded circuit.

According to one or more embodiments, a method of manufacturing a display apparatus includes forming, over a substrate, a display area in which a plurality of pixels are disposed; forming, over the substrate, a pad area in which a terminal portion connected to the display area is disposed; forming an insulating layer over a same layer in the display area and the pad area; and connecting a driving chip to the terminal portion of the pad area, and forming the insulating layer to have different thicknesses in the display area and the pad area.

The method of manufacturing a display apparatus may further include forming the insulating layer of a smaller thickness in the pad area than in the display area.

The method of manufacturing a display apparatus may further include forming the insulating layer of a smaller thickness in the entire pad area than a thickness of the insulating layer in the display area.

The method of manufacturing a display apparatus may further include forming the terminal portion in a closed loop, and forming the insulating layer of a thickness in an inside of the closed loop within the pad area less than a thickness of the insulating layer in an outside of the closed loop.

The method of manufacturing a display apparatus may further include forming the insulating layer of a thickness in the pad area about 50% less than that of the thickness of the insulating layer in the display area.

The method of manufacturing a display apparatus may further include forming a difference between the thickness of the insulating layer in the pad area and a thickness of the terminal portion in the pad area about 50% or less than that of the thickness of the terminal portion.

The method of manufacturing a display apparatus may further include stacking an active layer, a gate electrode, a first source/drain electrode, a second source/drain electrode, and a pixel electrode In each of the plurality of pixels of the display area, and forming a first via layer between the first source/drain electrode and the second source/drain electrode, and a second via layer between the second source/drain electrode and the pixel electrode in the insulating layer.

The method of manufacturing a display apparatus may further include forming an embedded circuit that inspects a normality or abnormality of the terminal portion in the pad area, and covering and protecting the embedded circuit with the insulating layer.

In an embodiment, a display apparatus may include a substrate including a display area in which a plurality of pixels are disposed and a pad area in which a terminal portion connected to the display area is disposed and input and output terminals in the pad area, a driving chip connected to the terminal portion of the pad area, and an insulating layer disposed over a same layer as in the display area and the pad area. The insulating layer may include first and second via layers in the pad area and in the display area, A height of the first and second via layers in the pad area may be different from a height of the first and second via layers in the display area. The height of the first and second via layers between the input and output terminals may be less than the height of the first and second via layers in the display area. A thickness of the insulating layer in the pad area may be about 50% or less than that of the thickness of the insulating layer in the display area.

BRIEF DESCRIPTION OF THE DRAWINGS

The above and other aspects, features, and advantages of the disclosure will be more apparent from the following description taken in conjunction with the accompanying drawings, in which.

DETAILED DESCRIPTION

Figure 1:
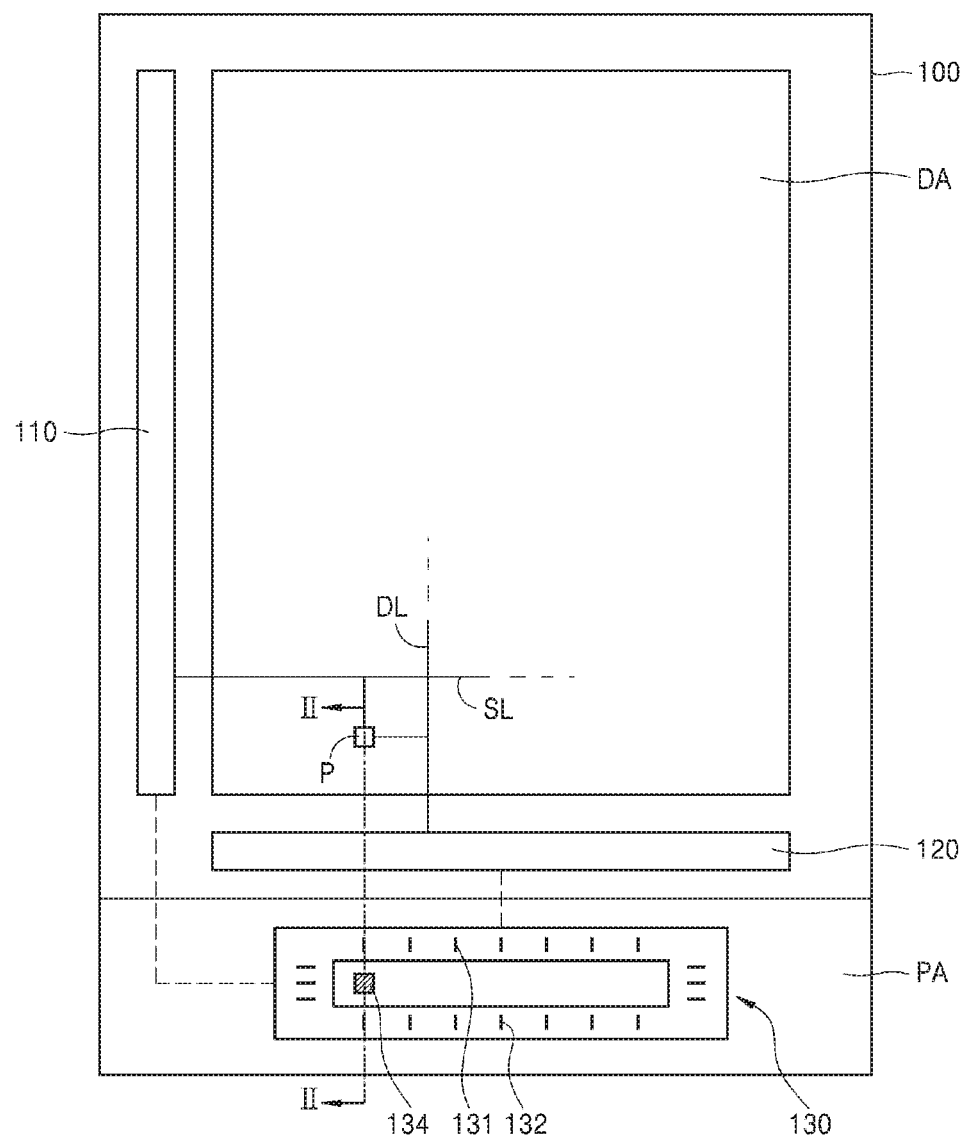
FIG. 1 is a plan view of a display apparatus according to an embodiment of the disclosure.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description. As used herein, the term "and/or" includes any and all combinations of one or more of the associated listed items. Expressions such as "at least one of," when preceding a list of elements, modify the entire list of elements and do not modify the individual elements of the list.

As the disclosure allows for various changes and numerous embodiments, aspects of embodiments will be illustrated in the drawings and described in detail in the written description. Hereinafter, effects and features of the disclosure and a method for accomplishing them will be described more fully with reference to the accompanying drawings, in which embodiments of the disclosure are shown. This disclosure may, however, be embodied in many different forms and should not be construed as limited to the embodiments set forth herein.

One or more embodiments of the disclosure will be described below in more detail with reference to the accompanying drawings. Those components that are the same or are in correspondence are rendered the same reference numeral regardless of the figure number, and redundant explanations are omitted.

Further, in the specification, the phrase "in a plan view" means when an object portion is viewed from above, and the phrase "in a schematic cross-sectional view" means when a schematic cross-section taken by vertically cutting an object portion is viewed from the side.

As used herein, the singular forms "a", "an" and "the" are intended to include the plural forms as well, unless the context clearly indicates otherwise.

It will be further understood that when the terms "comprises," "comprising," "includes" and/or "including" are used in this specification, they or it may specify the presence of stated features, integers, steps, operations, elements and/or components, but do not preclude the presence or addition of other features, integers, steps, operations, elements, components, and/or any combination thereof.

When a layer, film, region, substrate, or area, is referred to as being "on" another layer, film, region, substrate, or area, it may be directly on the other film, region, substrate, or area, or intervening films, regions, substrates, or areas, may be present therebetween. Conversely, when a layer, film, region, substrate, or area, is referred to as being "directly on" another layer, film, region, substrate, or area, intervening layers, films, regions, substrates, or areas, may be absent therebetween. Further when a layer, film, region, substrate, or area, is referred to as being "below" another layer, film, region, substrate, or area, it may be directly below the other layer, film, region, substrate, or area, or intervening layers, films, regions, substrates, or areas, may be present therebetween. Conversely, when a layer, film, region, substrate, or area, is referred to as being "directly below" another layer, film, region, substrate, or area, intervening layers, films, regions, substrates, or areas, may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Throughout the specification, when an element is referred to as being "connected" to another element, the element may be "directly connected" to another element, or "electrically connected" to another element with one or more intervening elements interposed therebetween.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 5% of the stated value.

Sizes of elements in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

It will be understood that when an element such as a layer, film, region, or substrate is referred to as being "on" or "over" another element, it can be directly on the other element or intervening element(s) may also be present. In contrast, when an element is referred to as being "directly on" another element, no intervening elements are present.

FIG. 1 illustrates a plan view and a planar structure of a display apparatus according to an embodiment of the disclosure. A panel of an organic light-emitting display apparatus is illustrated as an example of the display apparatus. While the organic light-emitting display apparatus is illustrated as an example, other displays are contemplated in accord with the spirit and scope of the disclosure.

As illustrated in FIG. 1, in the panel of the organic light-emitting display apparatus, a display area DA where pixels P are disposed and an image is realized, and a pad area PA (shown in FIGS. 5A-5D) having, provided thereon, a terminal portion 130 electrically connected to the display area DA may be provided over a substrate 100.

The terminal portion 130 may include input terminals 131 and output terminals 132, and a driving chip 10 (see, for example, FIG. 3A) may be coupled and connected to the terminal portion 130. In other words, the driving chip 10 of FIG. 3A and the display area DA may be connected to each other via the terminal portion 130.

Reference numeral 110 indicates a scan driver that applies a scan signal to a scan line SL disposed over the display area DA according to a signal of the driving chip 10. Reference numeral 120 indicates a data driver that applies a data signal to a data line DL disposed over the display area DA according to a signal of the driving chip 10. The driving chip 10 may be connected to the display area DA via the terminal portion 130, the scan driver 110, and a data driver 120, and, when the connection between the driving chip 10 and the terminal portion 130 is not stable, image realization on the display area DA may not be properly achieved.

Figure 2:
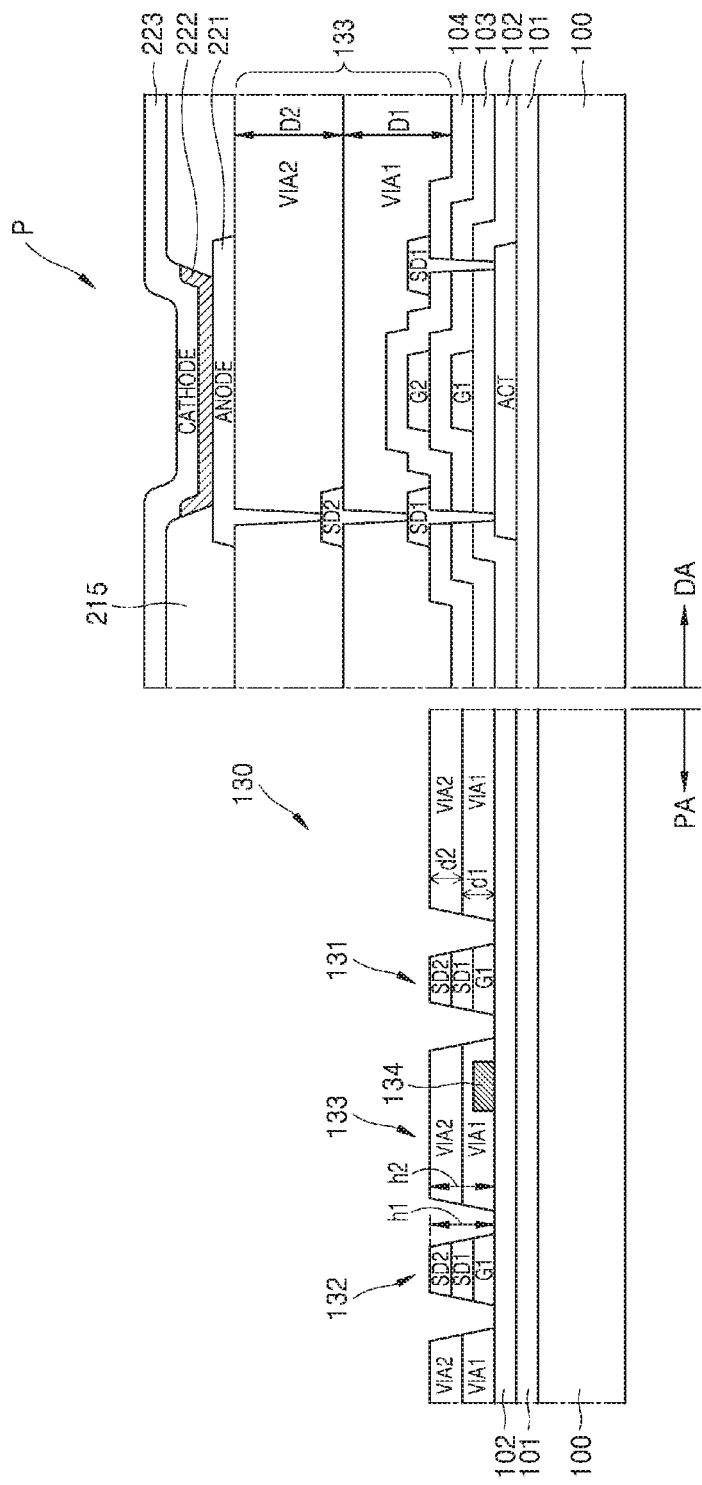
FIG. 2 is a schematic cross-sectional view taken along line II-II of FIG. 1.

Thus, according to the embodiment, to stably connect the driving chip 10 and the terminal portion 130, insulating layers 133 respectively formed over the same layers in the display area DA and the pad area PA have improved structures as shown in FIG. 2.

FIG. 2 is a schematic cross-sectional view taken along line of FIG. 1, and illustrates a structure of a pixel P in the display area DA over the right side and the vicinity of the terminal portion 130 in the pad area PA over the left side.

Because the pixel P and the terminal portion 130 may be simultaneously formed by stacking several conductive layers and several insulating layers over the substrate 100, materials used to form the respective elements may be identical. For example, the input terminal 131 and the output terminal 132 of the terminal portion 130 may be formed while layers such as a first gate electrode G1 which may also serve as a lower electrode of a capacitor to be described later on, a first source/drain electrode SD1, and a second source/drain electrode SD2 of the pixel P are being formed. An insulating layer 133 around the terminal portion 130 may be formed while layers such as a first via layer VIA1 and a second via layer VIA2 from among several insulating layers disposed in the pixel P are being stacked.

Thicknesses d1 and d2 of a first via layer VIA1 and a second via layer VIA2 of the insulating layer 133 disposed in the pad area PA may be made less than thicknesses D1 and D2 of the first via layer VIA1 and the second via layer VIA2 disposed in the pixel P of the display area DA. Differences in the thicknesses of the via layers in their respective areas may be realized by a difference in exposure and etching to generate a difference between the thicknesses of the display area DA and the pad area PA by using a halftone mask when the first via layer VIA1 and the second via layer VIA2 are formed using a photolithographic process.

The thicknesses d1 and d2 of the first via layer VIA1 and the second via layer VIA2 of the insulating layer 133 disposed in the pad area PA are made thin to prevent an increase in a step difference between the insulating layer 133 and the input and output terminals 131 and 132. When the step difference greatly increases due to an increase in a difference between a thickness h1 of each of the input and output terminals 131 and 132 and a thickness h2 of the insulating layer 133, a problem may occur such as an electrical connection problem when the driving chip 10 of FIG. 3A may be later connected to the display area DA by the terminal portion 130. Thus, to prevent electrical connection problems, the thicknesses d1 and d2 of the first via layer VIA1 and the second via layer VIA2 of the insulating layer 133 disposed in the pad area PA are made about 50% or less than the thicknesses D1 and D2 of the first via layer VIA1 and the second via layer VIA2 disposed in the display area DA.

Figure 3A:
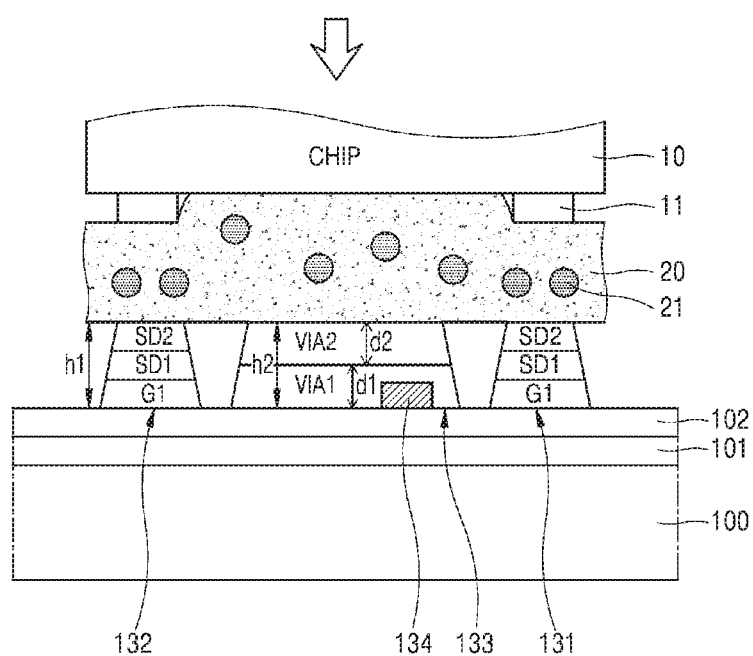
FIGS. 3A and 3B are schematic cross-sectional views illustrating a process of connecting a driving chip to a terminal portion of FIG. 2.
Figure 3B:
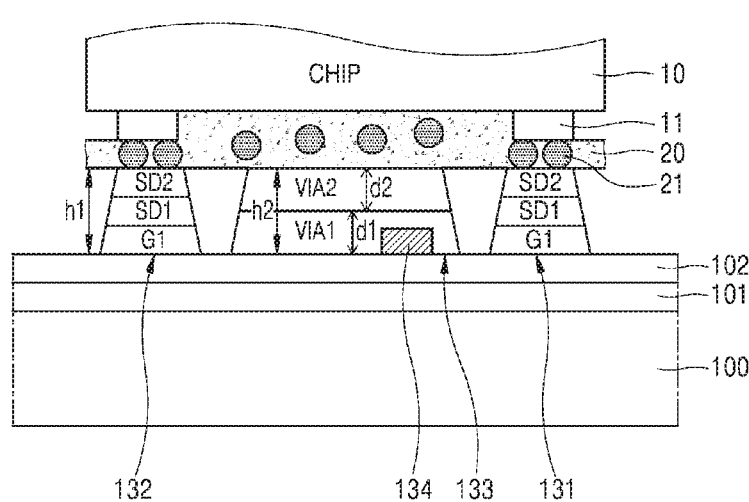

To facilitate an understanding of how the step difference may occur, a process of connecting the driving chip 10 will now be described with reference to FIGS. 3A through 4. FIGS. 3A and 3B illustrate schematic cross-sectional views illustrating a process of connecting the driving chip 10 to the terminal portion 130 and a structure of the embodiment, and FIG. 4 illustrates a structure having a severe step difference according to a comparative example that differs from embodiments herein.

As shown in FIG. 3A, when the driving chip 10 is connected to the terminal portion 130, the driving chip 10 is pressed down on and attached to the terminal portion 130 with an anisotropic conductive film 20 placed between bumps 11 of the driving chip 10 and the input and output terminals 131 and 132 of the terminal portion 130.

The anisotropic conductive film 20 includes conductive balls 21 distributed therein, and, when the anisotropic conductive film 20 is pressed as in FIG. 3B, a number of conductive balls 21 need to be distributed between the bump 11 and the input and output terminals 131 and 132, so that the driving chip 10 may be stably electrically connected to the terminal portion 130.

Figure 4:
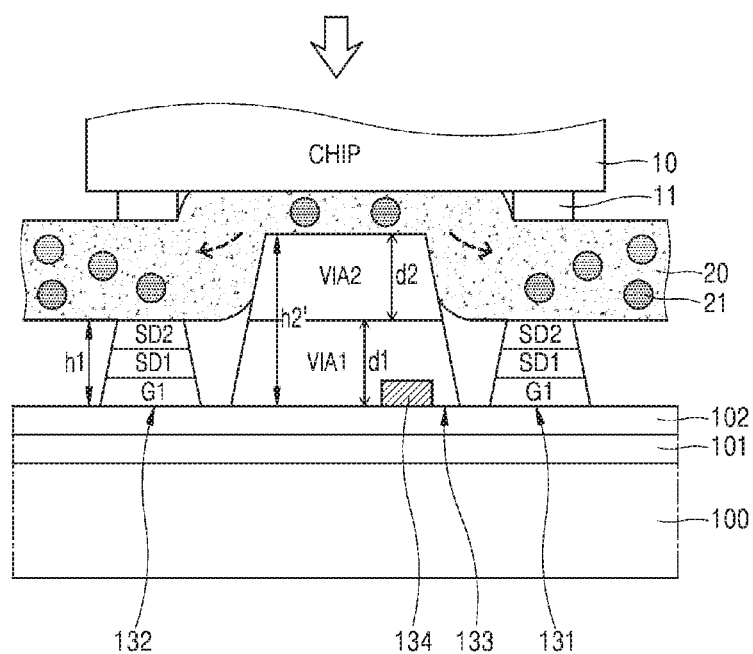
FIG. 4 is a schematic cross-sectional view illustrating a process of connecting a driving chip to a terminal portion having a structure as a comparative example.

However, if a thickness h2' of the insulating layer 133 is significantly greater than the thickness h1 of each of the input and output terminals 131 and 132 there is a large step difference as shown in FIG. 4. When the driving chip 10 is pressed down on and attached to the terminal portion 130, a large mass flow occurs in the anisotropic conductive film 20 in a direction from the center to the outside of the anisotropic conductive film 20, and accordingly a large number of conductive balls 21 are slipped out and flow to the outside. In other words, because a gap between the driving chip 10 and the insulating layer 133 is relatively less than a gap between the bumps 11 and the input and output terminals 131 and 132, a large pressure is applied to the center of the anisotropic conductive film 20, and thus the conductive balls 21 are not evenly distributed and are slipped out to and flow to the outside when pressing and attaching the driving chip 10. The conductive balls 21 are hardly distributed between the bumps 11 and the input and output terminals 131 and 132, leading to an electrically unstable connection. In other words, the number of conductive balls in order for proper electrical connection is compromised due to the large step difference as aforementioned.

To prevent this problem of unstable connection, the thicknesses d1 and d2 of the insulating layer 133 in the pad area PA are made about half or less than the thicknesses D1 and D2 of the insulating layer 133 in the display area DA, and consequently a difference between the thickness h2 of the insulating layer 133 and the thickness h1 of each of the input and output terminals 131 and 132 is made about 50% or less than the thickness h1 of each of the input and output terminals 131 and 132.

When the insulating layer 133 is originally absent in the pad area PA, a connection failure due to this step difference may not occur. However, because an embedded circuit or inspection circuit 134 is disposed in the pad area PA that inspects whether an electrical signal is properly connected in a product assembly stage, the insulating layer 133 is needed to cover and protect the embedded circuit 134.

A process of manufacturing the display apparatus having such a structure will be described in detail later, and an internal structure of the pixel P of the display area DA will now be described in greater detail.

Referring to the structure of the pixel P of the display area DA of FIG. 2, the substrate 100 may include a glass material or a polymer resin or any other suitable material.

A buffer layer 101 to prevent infiltration of impurities into an active layer ACT of a thin-film transistor may be formed over the substrate 100. The buffer layer 101 may include an inorganic insulating material, such as silicon nitride, silicon oxynitride, or silicon oxide, and may be a single layer or multiple layers including the inorganic insulating material.

The thin-film transistor and a capacitor may be disposed over the buffer layer 101. The thin-film transistor may include the active layer ACT, the first gate electrode G1, and the first source/drain electrode SD1. According to the embodiment, the thin-film transistor may be a top gate type in which the first gate electrode G1 is disposed over the active layer ACT with a first gate insulating layer 102 therebetween. However, according to an embodiment, the thin-film transistor may be a bottom gate type.

The active layer ACT may include polysilicon. As an example, the active layer ACT may include amorphous silicon, an oxide semiconductor, an organic semiconductor, or the like. The first gate electrode G1 may include a low-resistance metal material. The first gate electrode G1 may include a conductive material including, for example, molybdenum (Mo), aluminum (Al), copper (Cu), and titanium (Ti), and may be formed as a multi-layer or single layer including the aforementioned materials.

The first gate insulating layer 102 between the active layer ACT and the first gate electrode G1 may include an inorganic insulating material, such as silicon oxide, silicon nitride, silicon oxynitride, aluminum oxide, titanium oxide, tantalum oxide, or hafnium oxide. The first gate insulating layer 102 may be a single layer or multi-layer including the aforementioned materials.

The first source/drain electrode SD1 may be over the same layer as a layer over which the scan line SL is, and may include the same material as that included in the scan line SL. For example, the first source/drain electrode SD1 and the scan line SL may include aluminum (Al) having low resistance and high conductivity.

The capacitor may include a lower electrode G1 and an upper electrode G2 overlapping each other with a second gate insulating layer 103 therebetween. The capacitor may overlap the thin-film transistor. In other words, the first gate electrode G1 of the thin-film transistor may also serve as the lower electrode G1 of the capacitor. A top of the upper electrode G2 may be covered by an interlayer insulating layer 104. The upper electrode G2 may include a conductive material including molybdenum (Mo), aluminum (Al), copper (Cu), and titanium (Ti), and may be formed as a multi-layer or single layer including the aforementioned materials.

The term overlap may include layer, stack, face or facing, extending over, covering or partly covering or any other suitable term as would be appreciated and understood by those of ordinary skill in the art. The terms 'do not overlap' may include 'apart from' or 'set aside from' or 'offset from' and any other suitable equivalents as would be appreciated and understood by those of ordinary skill in the art.

The second gate insulating layer 103 and the interlayer insulating layer 104 may include an inorganic insulating material, such as silicon oxide, silicon nitride, silicon oxynitride, aluminum oxide, titanium oxide, tantalum oxide, or hafnium oxide. Each of the second gate insulating layer 103 and the interlayer insulating layer 104 may be a single layer or multi-layer including the aforementioned materials.

The thin-film transistor and the capacitor may be covered by the first via layer VIA1. An upper surface of the first via layer VIA1 may include an approximately flat surface.

The second source/drain electrode SD2, functioning as a contact metal layer, may be between the thin-film transistor and a pixel electrode 221. The second source/drain electrode SD2 may contact the thin-film transistor through a contact hole formed in the first via layer VIAL and the pixel electrode 221 may contact the second source/drain electrode SD2 through a contact hole formed in the second via layer VIA2. The second source/drain electrode SD2 may be over the same layer as a layer over which the data line DL is, and may include the same material as that included in the data line DL. For example, the second source/drain electrode SD2 and the data line DL may include aluminum (Al) having low resistance and high conductivity. Thus, the first and second source/drain electrodes SD1 and SD2, the scan line SL, and the data line DL may all include the same low-resistance metal material.

The first via layer VIA1 and the second via layer VIA2 of the insulating layer 133 may include an organic insulating material, such as a commercial polymer (such as polymethyl methacrylate (PMMA) or polystyrene (PS)), a polymer derivative having a phenol-based group, an acryl-based polymer, an imide-based polymer, an acryl ether-based polymer, an amide-based polymer, a fluorine-based polymer, a p-xylene-based polymer, a vinyl alcohol-based polymer, or a blend of the foregoing materials. According to an embodiment, the first via layer VIA1 and the second via layer VIA2 may include polyimide. The list of materials for the first via layer VIA1 and the second via layer VIA2 of the insulating layer 133 is non-exhaustive and may include other suitable materials as would be appreciated and understood by those of ordinary skill in the art.

The pixel electrode 221 may be over the second via layer VIA2. The pixel electrode 221 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). According to an embodiment, the pixel electrode 221 may include a reflection layer including, for example, silver (Ag), magnesium (Mg), aluminum (Al), platinum (Pt), palladium (Pd), gold (Au), nickel (Ni), neodymium (Nd), iridium (Ir), chromium (Cr), or a compound of these materials. According to an embodiment, the pixel electrode 221 may include a film formed of ITO, IZO, ZnO, or $In_2O_3$ above/below the reflection layer.

A pixel defining layer 215 may be over the pixel electrode 221. The pixel defining layer 215 may include an opening via which an upper surface of the pixel electrode 221 is exposed, and may cover an edge of the pixel electrode 221. The pixel defining layer 215 may include an organic insulating material. As an example, the pixel defining layer 215 may include an inorganic insulating material, such as silicon nitride ($SiN_x$), silicon oxynitride (SiON), or silicon oxide ($SiO_x$). As another example, the pixel defining layer 215 may include an organic insulating material and an inorganic insulating material.

An emission layer 222 over the pixel electrode 221 may include a low molecular or high molecular organic material that emits light of a certain color. A hole injection layer (HIL), a hole transport layer (HTL), an electron transport layer (ETL) and an electron injection layer (EIL), for example, may be stacked over the pixel electrode 221 to be adjacent to the emission layer 222.

The emission layer 222 may be formed independently in each pixel such that pixels emitting red light, green light, and blue light constitute a single pixel unit, or an emission layer may be commonly formed over the entire pixel region regardless of locations of the pixels. The emission layer may be formed, for example, by vertically stacking a layer including a light-emitting substance that emits red light, a layer including a light-emitting substance that emits green light, and a layer including a light-emitting substance that emits blue light on one another, or by mixing a layer including a light-emitting substance that emits red light, a layer including a light-emitting substance that emits green light, and a layer including a light-emitting substance that emits blue light. Any combination of other various colors that emits a white light may be utilized. The display apparatus may include a color converting layer or a color filter that coverts the emitted white light into a light of a given color.

An opposite electrode 223 may include a conductive material having a low work function. For example, the opposite electrode 223 may include a transparent or semi-transparent layer including, for example, silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca) or an alloy of these materials.

When the first gate electrode G1 and the first and second source/drain electrodes SD1 and SD2 of the display area DA are formed, the input and output terminals 131 and 132 of the pad area PA may also be formed. When the first and second via layers VIA1 and VIA2 are formed, the insulating layer 133 of the pad area PA may also formed. The embedded circuit 134 may be over the same layer as a layer over which one of the first gate electrode G1 and the first and second source/drain electrodes SD1 and SD2 is, and may include the same material as that included in one of the first gate electrode G1 and the first and second source/drain electrodes SD1 and SD2.

The display apparatus having this structure may be manufactured according to a method illustrated in FIGS. 5A through 5E.

Figure 5A:
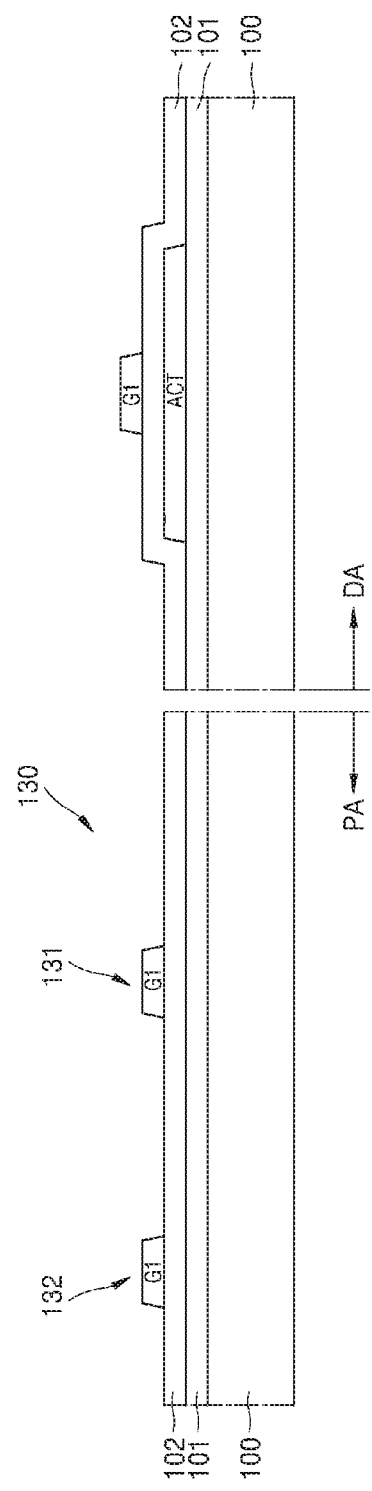
FIGS. 5A through 5E are schematic cross-sectional views for describing a method of manufacturing the display apparatus shown in FIG. 2.

As shown in FIG. 5A, the buffer layer 101 and the first gate insulating layer 102 may be formed in the display area DA and the pad area PA over the substrate 100, and the first gate electrode G1 of the display area DA may be formed over the first gate insulating layer 102. Respective lower portions of the input and output terminals 131 and 132 may be formed in the pad area PA over the same layer as the layer over which the first gate electrode G1 may be formed, and may be formed of the same material as the material used to form the first gate electrode G1.

Figure 5B:
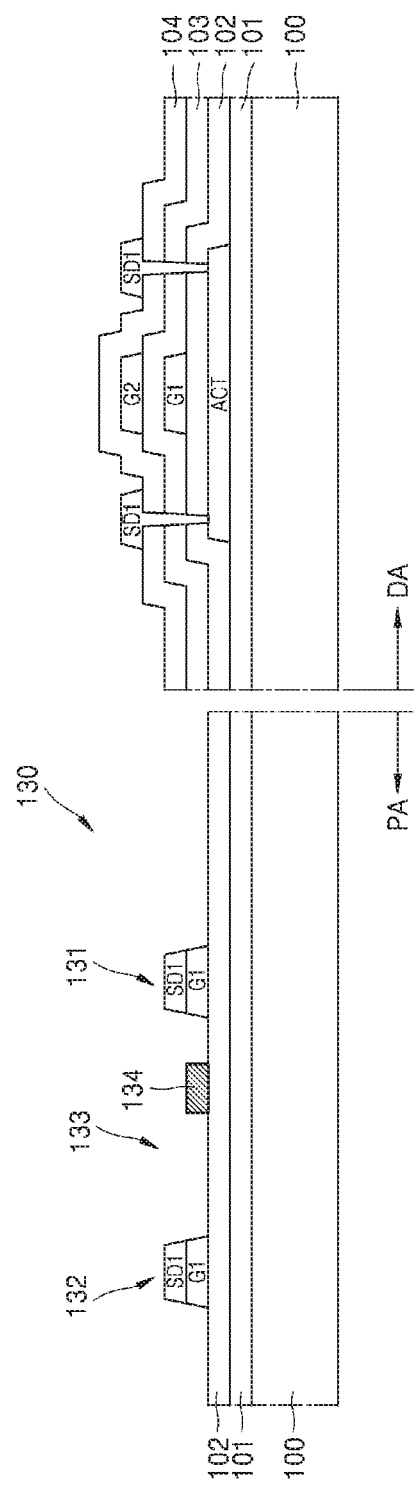

As shown in FIG. 5B, the upper electrode G2 and the first source/drain electrode SD1 may be formed in the display area DA. Respective middle portions of the input and output terminals 131 and 132 may be formed in the pad area PA over the same layer as the layer over which the first source/drain electrode SD1 may be formed, and may be formed of the same material as the material used to form the first source/drain electrode SD1. The embedded circuit 134 may also be formed.

Figure 5C:
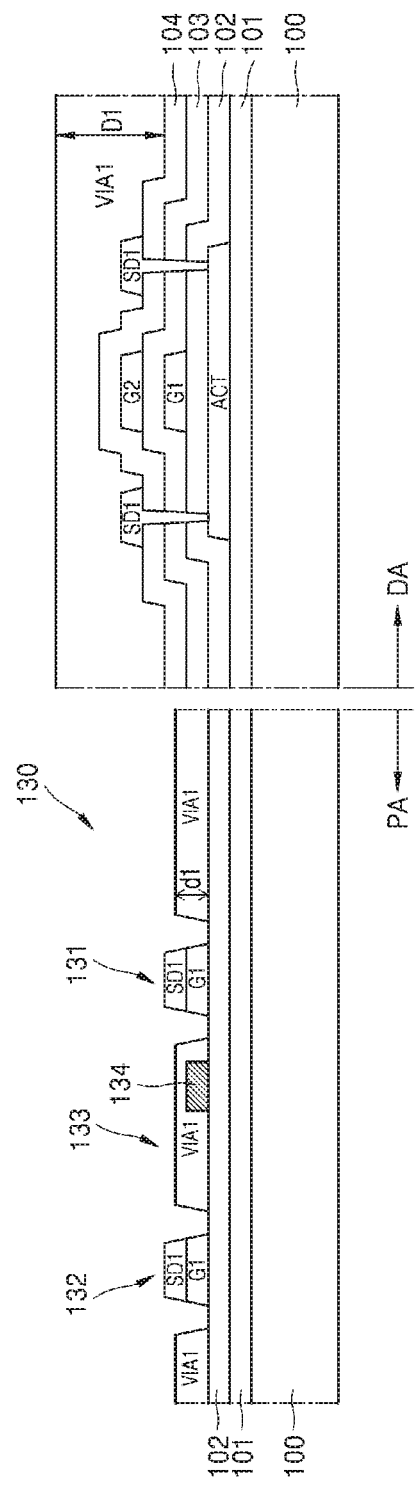

As shown in FIG. 5C, the first via layer VIA1 may be formed over both the display area DA and the pad area PA. As described above, the thickness d1 of the first via layer VIA1 in the pad area PA is made about half or less than the thickness D1 of the first via layer VIA1 in the display area DA by using a halftone mask, in order to reduce a step difference due to a difference between the thickness of each of the input and output terminals 131 and 132 and the thickness of the insulating layer 133 as described above.

Figure 5D:
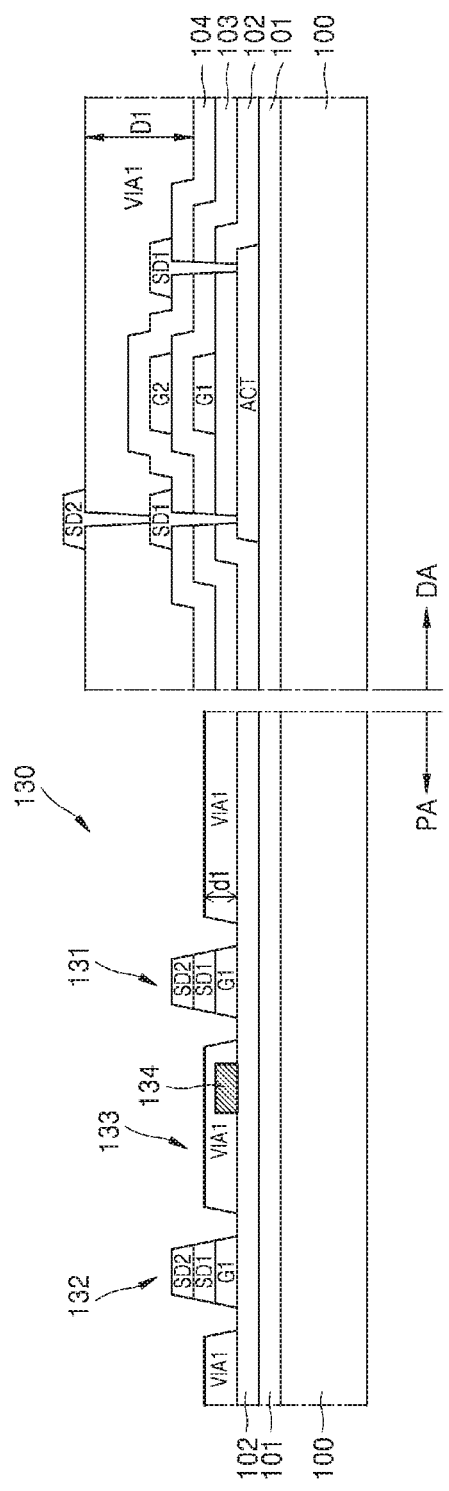

As shown in FIG. 5D, the second source/drain electrode SD2 may be formed in the display area DA. Respective upper portions of the input and output terminals 131 and 132 may be formed in the pad area PA over the same layer as the layer over which the second source/drain electrode SD2 may be formed, and may be formed of the same material as the material used to form the second source/drain electrode SD2.

Figure 5E:
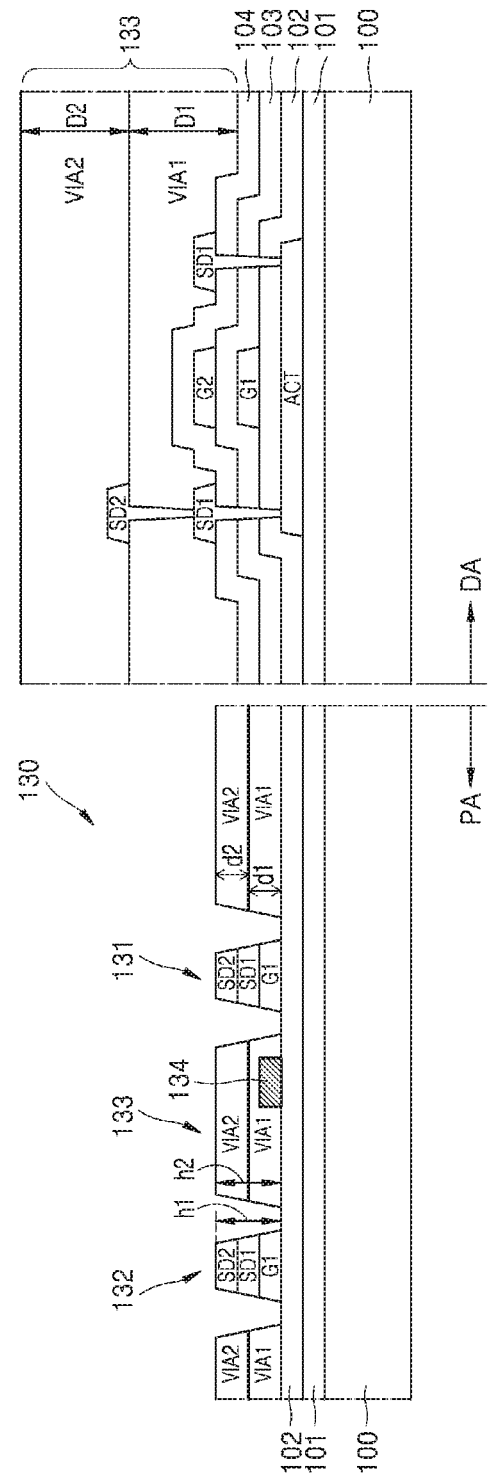

As shown in FIG. 5E, the second via layer VIA2 may be formed over both the display area DA and the pad area PA. Similarly, the thickness d2 of the second via layer VIA2 in the pad area PA may be made about half or less than the thickness D2 of the second via layer VIA2 in the display area DA by using a halftone mask. The thickness h2 of the insulating layer 133 and the thickness h1 of each of the input and output terminals 131 and 132 may become similar to each other in the pad area PA, and thus a step difference may rarely be generated. Even when a step difference may not be completely prevented, when the step difference is about 50% or less than the thickness h1 of each of the input and output terminals 131 and 132, a large mass flow of conductive balls 21 may be sufficiently prevented from occurring in the anisotropic conductive film 20 (see FIG. 3B) when the driving chip 10 is attached.

When the pixel electrode 221, the emission layer 222, and the opposite electrode 223 are formed, the display apparatus as shown in FIG. 2 may be realized.

When the driving chip 10 is connected to the terminal portion 130 of the pad area PA of the display apparatus according to the above, the driving chip 10 is pressed down on and attached to the terminal portion 130 with the anisotropic conductive film 20 placed between the bumps 11 of the driving chip 10 and the input and output terminals 131 and 132 of the terminal portion 130, as shown in FIGS. 3A and 3B.

Accordingly, a step difference may seldom be generated between the insulating layer 133 and the input and output terminals 131 and 132, and thus a large mass flow may not occur in the anisotropic conductive film 20, and accordingly, suitable conductive balls 21 may be distributed between the bumps 11 and the input and output terminals 131 and 132, leading to an electrically-stable connection.

Thus, a stable connection between the terminal portion 130 and the driving chip 10 may be secured, and accordingly, a connection failure of the driving chip 10 may be prevented to thereby improve the reliability of products.

Figure 6:
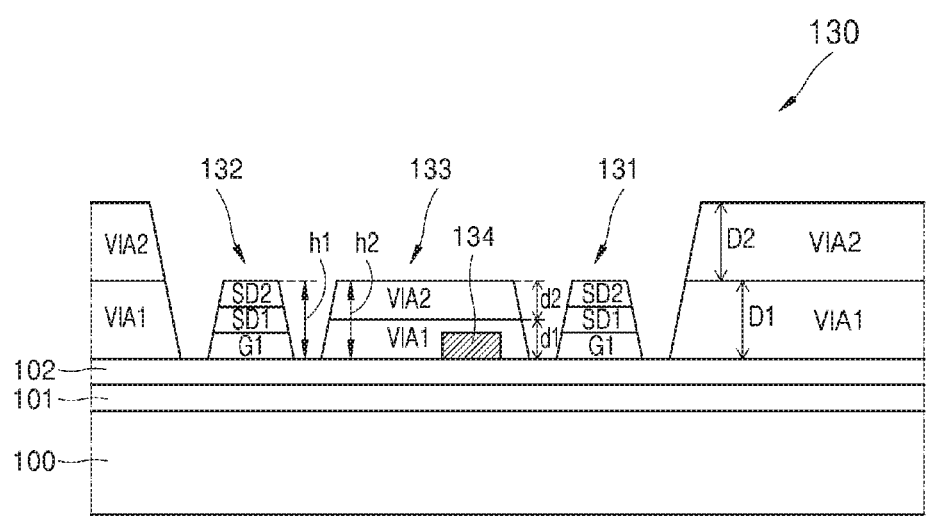
FIG. 6 is a schematic cross-sectional view of a pad area of a display apparatus according to an embodiment of the disclosure.

According to the above-described embodiment, a formation of the thickness h1 of the insulating layer 133 to be thin with respect to the pad area PA is illustrated. As shown in FIG. 6, the insulating layer 133 existing between the input and output terminals 131 and 132 may be formed thin, or, only the insulating layer 133 existing between the input and output terminals 131 and 132 may be formed thin.

In other words, as shown in FIG. 1, the pad area PA may be located in a lower end portion of a panel, and the terminal portion 130 may have a shape of a closed loop of which the or a center may be hollow. According to the above-described embodiment, the insulating layer 133 may be formed thin over the entire lower end portion of the panel, which is the pad area PA. However, because the insulating layer 133 does not have to serve as an obstacle when the driving chip 10 may be attached, the entire pad area PA may not be formed thin, and rather a space between the input terminal 131 and the output terminal 132 facing the driving chip 10, namely, only the inside of the closed loop, may be formed thin, or, only a space between the input terminal 131 and the output terminal 132 facing the driving chip 10, namely, only the inside of the closed loop, may be formed thin. In other words, a thickness of the insulating layer 133 inside the closed loop within the pad area PA may be less than a thickness of the insulating layer outside the closed loop.

A stable connection between the terminal portion 130 and the driving chip 10 may be still secured.

Therefore, according to a display apparatus according to the above-described embodiment and a method of manufacturing the same, a stable connection between a terminal portion and a driving chip of a pad area may be secured, and a connection failure of the driving chip may be prevented, leading to an improvement in the reliability of products.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
a panel including:
a substrate comprising a display area where a plurality of pixels are disposed and a pad area where a terminal portion connected to the display area is disposed;
a plurality of electrically conductive terminals disposed in the terminal portion, the plurality of terminals defining a hollowed area therebetween;
an insulating layer disposed in the display area and the pad area such that the insulating layer is disposed in the hollowed area and is spaced apart from the terminals, wherein a thickness of the insulating layer in the display area is different from a thickness of the insulating layer in the pad area; and
a driving chip connected to the terminal portion of the pad area.

2. The display apparatus of claim 1, wherein
the thickness of the insulating layer in the pad area is less than the thickness of the insulating layer in the display area.

3. The display apparatus of claim 2, wherein
a thickness of the insulating layer in the entire pad area is less than the thickness of the insulating layer in the display area.

4. The display apparatus of claim 2, wherein
the terminal portion is a closed loop, and
a thickness of the insulating layer inside the closed loop within the pad area is less than a thickness of the insulating layer outside the closed loop.

5. The display apparatus of claim 2, wherein
the thickness of the insulating layer in the pad area is about 50% or less than that of the thickness of the insulating layer in the display area.

6. The display apparatus of claim 2, wherein
a difference between the thickness of the insulating layer in the pad area and a thickness of the terminal portion in the pad area is about 50% or less than that of the thickness of the terminal portion.

7. The display apparatus of claim 1, wherein
in each of the plurality of pixels of the display area, an active layer, a gate electrode, a first source/drain electrode, a second source/drain electrode, and a pixel electrode are stacked, and
the insulating layer comprises a first via layer between the first source/drain electrode and the second source/drain electrode, and a second via layer between the second source/drain electrode and the pixel electrode.

8. The display apparatus of claim 7,
further comprising a scan line and a data line connected to each of the plurality of pixels of the display area, wherein
the scan line is disposed over a same layer as a layer over which the first source/drain electrode is disposed, and comprises a same material as a material of the first source/drain electrode, and
the data line is over a same layer as a layer over which the second source/drain electrode is disposed, and comprises a same material as a material of the second source/drain electrode.

9. The display apparatus of claim 1, wherein
an embedded circuit that inspects a normality or abnormality of the terminal portion is disposed in the pad area, and
the insulating layer covers and protects the embedded circuit.

10. The display apparatus of claim 1, wherein the terminals and the insulating layer are both directly disposed on a top surface of a common insulating layer.

11. The display apparatus of claim 1, wherein the insulating layer occupies a center of the hollowed area.

12. A method of manufacturing a display apparatus, the method comprising:
forming, over a substrate, a display area in which a plurality of pixels are disposed;
forming, over the substrate, a pad area in which a terminal portion connected to the display area is disposed, the terminal portion including electrically conductive terminals defining a hollowed area therebetween;
forming an insulating layer in the display area and the pad area such that the insulating layer is disposed inside the hollowed area and is spaced apart from the terminals; and
connecting a driving chip to the terminal portion of the pad area wherein
a thickness of the insulating layer in the display area is different than a thickness of the insulating layer in the pad area.

13. The method of claim 12, further comprising
forming the insulating layer of a smaller thickness in the pad area than in the display area.

14. The method of claim 13, further comprising
forming the insulating layer of a smaller thickness in the entire pad area than a thickness of the insulating layer in the display area.

15. The method of claim 13, further comprising
forming the terminal portion in a closed loop, and
forming the insulating layer of a thickness inside the closed loop within the pad area less than a thickness of the insulating layer outside the closed loop.

16. The method of claim 13, further comprising
forming the insulating layer of a thickness in the pad area about 50% or less than that of the thickness of the insulating layer in the display area.

17. The method of claim 13, further comprising
forming a difference between the thickness of the insulating layer in the pad area and a thickness of the terminal portion in the pad area to be about 50% or less than that of the thickness of the terminal portion.

18. The method of claim 12, further comprising
stacking an active layer, a gate electrode, a first source/drain electrode, a second source/drain electrode, and a pixel electrode in each of the plurality of pixels of the display area, and
forming a first via layer between the first source/drain electrode and the second source/drain electrode, and a second via layer between the second source/drain electrode and the pixel electrode in the insulating layer.

19. The method of claim 12, further comprising
forming an embedded circuit that inspects a normality or an abnormality of the terminal portion in the pad area, and
covering and protecting the embedded circuit with the insulating layer.

20. A display apparatus comprising:
a substrate comprising a display area in which a plurality of pixels are disposed;
a pad area in which a terminal portion connected to the display area is disposed, the terminal portion including electrically conductive input and output terminals that define a hollowed area therebetween;
a driving chip connected to the terminal portion of the pad area; and
an insulating layer disposed in the display area and the pad area such that the insulating layer is disposed inside the hollowed area and is spaced apart from the input and output terminals, the insulating layer comprising first and second via layers in the pad area and in the display area, wherein
a height of the first and second via layers in the pad area is different from a height of the first and second via layers in the display area.

21. The display apparatus of claim 20, wherein the height of the first and second via layers between the input and output terminals is less than the height of the first and second via layers in the display area.

22. The display apparatus of claim 20, wherein a thickness of the insulating layer in the pad area is about 50% or less than that of the thickness of the insulating layer in the display area.

* * * * *